United States Patent
Jeong et al.

(10) Patent No.: US 7,049,742 B2
(45) Date of Patent: May 23, 2006

(54) METHOD AND STRUCTURE FOR SUBSTRATE HAVING INSERTED ELECTRODES FOR FLAT DISPLAY DEVICE AND THE DEVICE USING THE STRUCTURE

(76) Inventors: Kwang-Ho Jeong, 792-8, Janghang-dong, ILsan-gu, Goyang-si, Kyunggi-do, 411-380 (KR); Shin-Cheul Kim, 910-901 Gangsun Village, ILsan-gu, Goyang-si, Kyunggi-do, 411-370 (KR)

( * ) Notice: Subject to any disclaimer, the term of this patent is extended or adjusted under 35 U.S.C. 154(b) by 189 days.

(21) Appl. No.: 10/398,827

(22) PCT Filed: Oct. 9, 2001

(86) PCT No.: PCT/KR01/01692

§ 371 (c)(1),
(2), (4) Date: Apr. 8, 2003

(87) PCT Pub. No.: WO02/32193

PCT Pub. Date: Apr. 18, 2002

(65) Prior Publication Data

US 2005/0098533 A1 May 12, 2005

(30) Foreign Application Priority Data

Oct. 9, 2000 (KR) ................. 2000-59298
Oct. 8, 2001 (KR) ................. 2001-61927

(51) Int. Cl.
*H05B 33/02* (2006.01)

(52) U.S. Cl. .................. 313/506; 313/498; 313/505
(58) Field of Classification Search ........... 313/500, 313/505, 506, 509, 582; 445/24, 46, 49

See application file for complete search history.

(56) References Cited

U.S. PATENT DOCUMENTS

| 6,091,078 | A | * | 7/2000 | Codama ................. 257/40 |
| 6,157,127 | A | * | 12/2000 | Hosokawa et al. ......... 313/506 |
| 6,437,507 | B1 | * | 8/2002 | Ha ..................... 313/587 |
| 6,639,358 | B1 | * | 10/2003 | Ishikawa et al. ............ 313/504 |

FOREIGN PATENT DOCUMENTS

| JP | 10-335070 | 12/1998 |
| JP | 2001-110574 | 4/2001 |
| WO | 97/34447 | 9/1997 |

* cited by examiner

*Primary Examiner*—Nimeshkumar D. Patel
*Assistant Examiner*—Matt Hodges
(74) *Attorney, Agent, or Firm*—Ladas & Parry LLP

(57) ABSTRACT

The present invention relates to a structure of a substrate with electrodes embedded thereinto for use in a flat display device, the device having the structure of the substrate, and a method of manufacturing the structure of the substrate and the device, wherein a problem produced in a case where the electrodes protrude from the substrate for use in the flat display device can be solved, the resistance of the electrodes can be reduced by increasing the cross-sectional areas thereof, the amount of luminescence emitted to the front of the luminescence device can be increased, and the substrate can be kept flat even though the thickness of the electrodes is increased. The device is formed on the substrate (10) by etching a top surface of the substrate (10) for use in the flat display device in a predetermined pattern and then embedding the electrodes into the etched portions or grooves (11). Accordingly, the device can be kept flat and maintain a uniform shape even after a hole transport layer or an electron transport layer has been formed thereon, the yield of the device can be increased, and voltage drop due to the electrodes in a case where the display device becomes larger in area can be minimized, and the amount of luminescence emitted to the front of the device can be increased.

5 Claims, 4 Drawing Sheets

METHOD AND STRUCTURE FOR SUBSTRATE HAVING INSERTED ELECTRODES FOR FLAT DISPLAY DEVICE AND THE DEVICE USING THE STRUCTURE

TECHNICAL FIELD

The present invention relates to a structure of a substrate with electrodes embedded thereinto for use in a flat display device, the flat display device having the structure of the substrate, and a method of manufacturing the structure of the substrate and the device, wherein a problem produced in a case where the electrodes are formed to protrude from the substrate for use in the flat display device can be solved, the substrate can be kept flat even though the thickness of the electrodes is increased, the electrodes can be adjusted, if desired, in thickness, and at the same time, voltage drop due to the electrodes when the device becomes larger in area can be minimized, and the amount of luminescence emitted to the front of the device can be increased.

BACKGROUND ART

Generally, electrode material for use in an electroluminescent device is formed on an entire substrate in the form of a thin film, and then patterned in a particular configuration depending on an object of a process.

Conventional methods of manufacturing electrodes for use in a flat display device include a method of putting a mask above a substrate and forming a thin film only on exposed portions of the substrate, and a method of forming a thin film of electrode on the entire substrate and then etching unnecessary portions of the thin film of electrode.

Particularly, the latter method is primarily used for indium-tin-oxide ($In_2O_3$:Sn, ITO) containing zinc oxide which is employed in the electroluminescent device. and the ITO is etched in a line or particular configuration.

In a case where the electrodes are formed in the above conventional configuration, a process of manufacturing the electrodes is as follows:

That is, the process comprises the steps of cleaning a substrate; forming a thin film of electrode on the entire substrate; coating photoresist on the thin film of electrode; putting a mask with patterns above the photoresist, exposing the masked surface of the substrate to light and developing the exposed surface; removing unnecessary portions of the photoresist and etching unnecessary portions of the thin film of electrode; and removing the remaining portions of the photoresist and cleaning the substrate.

Accordingly, as shown in FIG. 1, conventional electrodes 2 formed on the substrate 1 protrude therefrom. Since a thin film formed on the electrodes is processed depending on the configuration of the electrodes, the thin film protrudes at portions where the electrodes 2 remain and is depressed at portions where the electrodes 2 have been etched.

When additional electrodes having the opposite polarity are formed in a rugged profile on this thin film, non-uniformity of the thin film and concentration of an electric field on edge portions of the electrodes cause the electric field to be unevenly distributed between the electrodes.

Such a problem causes leakage current between the electrodes, thereby leading to various problems such as non-uniform luminescent characteristics between pixels or a low efficiency of the device.

Moreover, when the thickness of the electrodes formed on the substrate is reduced to alleviate the above problems, the resistance of the electrodes themselves is increased, and thus, voltage drop is produced within the electrodes.

Particularly, there is a problem in that the voltage drop produced within the electrodes limits the operation of the display device when the display device becomes larger in size.

Further, line widths of the electrodes are reduced in a case where the size of pixels is reduced, for example, in case of a micro display device. Therefore, according to the conventional methods, there are disadvantages in that it is difficult to implement the device due to the voltage drop produced within the electrodes, and there are also numerous difficulties in manufacturing the device.

DISCLOSURE OF INVENTION

The present invention is contemplated to solve the above problems. An object of the present invention is to provide a structure of a substrate with electrodes embedded thereinto for use in a flat display device, the device having the structure of the substrate, and a method of manufacturing the structure of the substrate and the device, wherein a problem produced in a case where the electrodes are formed to protrude from the substrate for use in the flat display device can be solved, the substrate can be kept flat even though the thickness of the electrodes is increased, the electrodes can be adjusted, if desired, in the degree of protrusion, and at the same time, voltage drop due to the electrodes can be reduced by increasing cross-sectional areas of the electrodes, and the amount of luminescence emitted to the front of the device can be increased.

According to an aspect of the present invention, the above object is accomplished by providing a structure of a substrate with electrodes embedded thereinto for use in a flat display device, wherein the structure is formed by parallel etching a top surface of the substrate for the flat display device at a predetermined interval and depth and then embedding the electrodes into the etched portions; and the display device using the structure of the substrate.

According to another aspect of the present invention, the above object is accomplished by providing a method of manufacturing a substrate with electrodes embedded thereinto for use in a flat display device, comprising the cleaning step of cleaning the substrate; the coating step of coating photoresist on the substrate; the masking step of positioning a mask with patterns formed thereon above the photoresist; the developing step of exposing the masked surface of the substrate to light and developing the exposed surface; the removing step of removing unnecessary portions of the photoresist; and the etching step of etching portions of the substrate into which the electrodes are to be embedded.

BEST MODE FOR CARRYING OUT THE INVENTION

Hereinafter, preferred embodiments of the present invention will be explained in detail with reference to the accompanying drawings.

Figure 1:
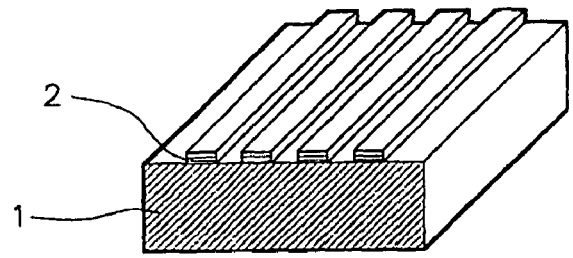
FIG. 1 is a perspective view showing a conventional substrate for use in a flat display device and the arrangement of electrodes formed thereon.
Figure 2:
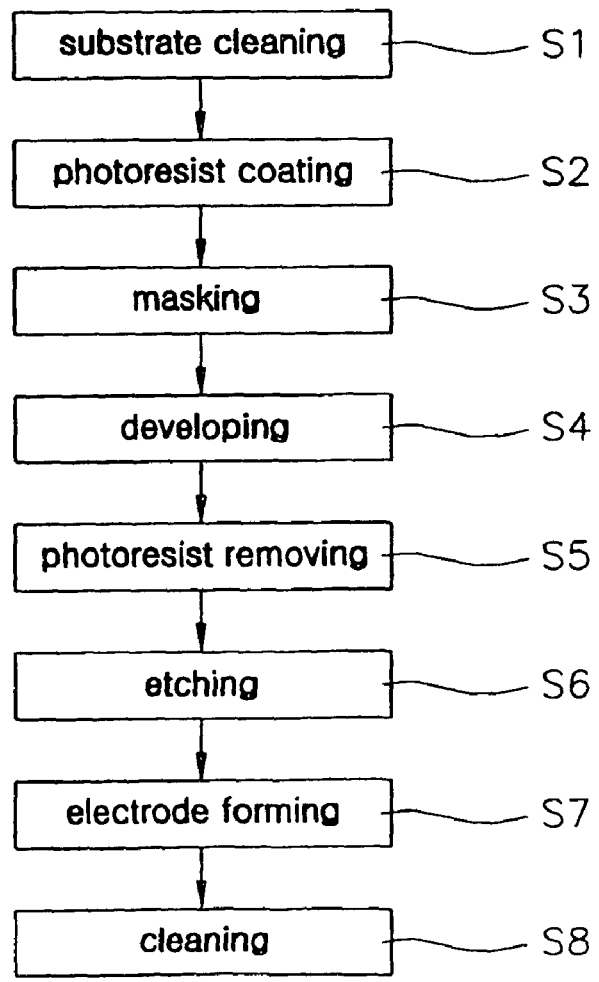
FIG. 2 is a flowchart showing a method of manufacturing a substrate with electrodes embedded thereinto for use in a flat display device according to the present invention.

FIG. 2 is a flowchart showing a method of manufacturing a substrate with electrodes embedded thereinto for use in a flat display device according to the present invention. The method is characterized by the cleaning step S2 of cleaning the substrate; the coating step S2 of coating photoresist on the substrate; the masking step S3 of positioning a mask with patterns formed thereon above the photoresist; the developing step S4 of exposing the masked surface of the substrate to light and developing the exposed surface; the removing step S5 of removing unnecessary portions of the photoresist, and the etching step S6 of etching portions of the substrate into which the electrodes are to be embedded.

Further, in addition to the above steps the method may be more specifically implemented by further comprising the electrode forming steps S7 of forming the electrodes on the etched portions of the substrate after the etching step S6; and the cleaning step S8 of removing the remaining portions of the photoresist and cleaning the substrate.

The electrodes may be formed to be flush with the surface of the substrate etched in the etching step S6. In some cases, it is desirable that the electrodes be formed to be raised or lowered from the surface of the substrate so as to adapt to desired electrical characteristics of the substrate. The height of the electrodes should be determined depending on the characteristics of a thin film to be formed thereon.

The method may further comprise the insulation film forming step of forming an insulation film on the substrate between the cleaning step SI and the coating step S2. In a case where glass is used as the substrate, this step serves to reduce the phenomenon that ions such as Na included in the glass are diffused and affect electrical conductivity of the transparent electrodes. In some cases, there is a need for the step of forming the insulation film of $SiO_2$, $Al_2O_3$, or the like on the glass.

Figure 3:
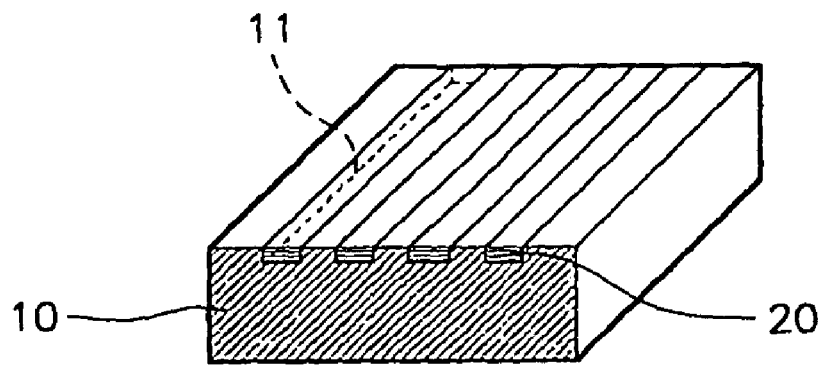
FIG. 3 is a perspective view showing a structure of the substrate manufactured by the method of manufacturing the substrate with the electrodes embedded thereinto for use in the flat display device according to the present invention.

FIG. 3 is a perspective view showing the structure of the substrate manufactured by the method of manufacturing the substrate with the electrodes embedded thereinto for use in the flat display device according to the present invention. This figure shows a substrate 10 formed with grooves 11 in a predetermined pattern and electrodes 20 formed in the grooves 11 which are manufactured by the steps of parallel etching a top surface of the substrate 10 for use in the flat display device at a predetermined interval and depth so as to form the grooves 11 and then embedding the electrodes 20 into the etched grooves.

Figure 4:
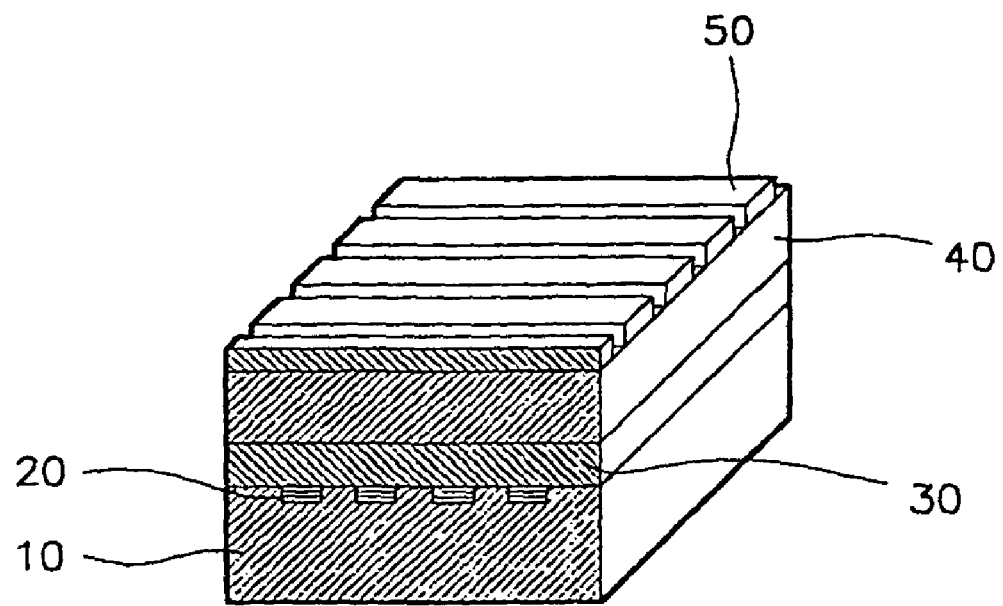
FIG. 4 is a perspective view showing an organic electroluminescent device formed on the structure of the substrate shown in FIG. 3.
Figure 5A:
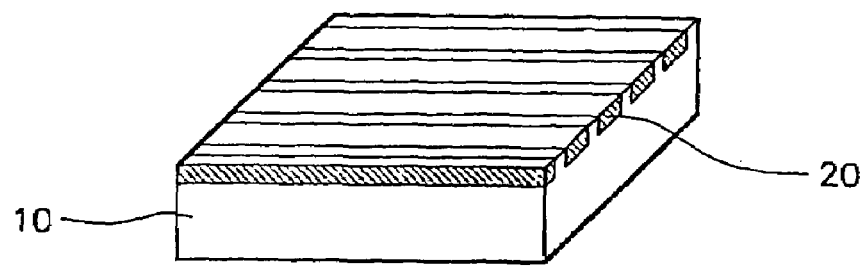
FIGS. 5a to 5d are reference views showing the steps of a process in a technique of forming cathode separators usable on the structure of the substrate of the present invention.
Figure 5B:
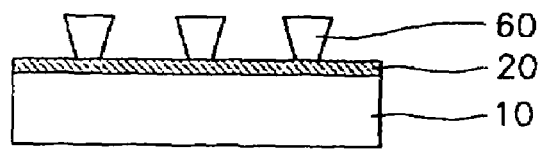
Figure 5C:
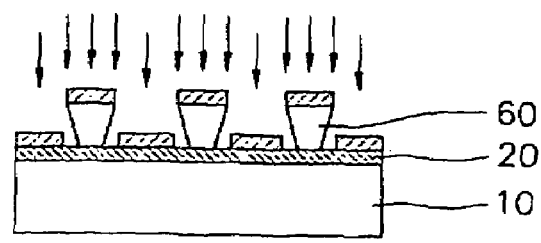
Figure 5D:
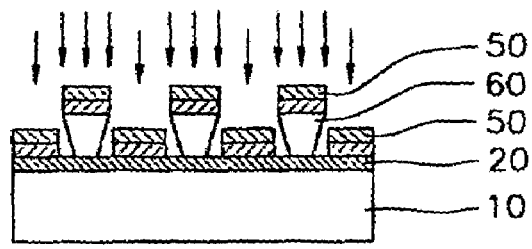

FIG. 4 is a perspective view showing an organic electroluminescent device manufactured together with the structure of the substrate of the present invention. In the figure, a hole transport layer 30, an electron transport layer (luminescent layer) 40 and additional electrodes 50 having a polarity opposite to that of the electrodes 20 are formed on the substrate 10.

In some cases, as shown in FIGS. 5a to 5d, by using a technique of forming cathode separators 60 on the substrate with the electrodes (anode in this case) I 0 embedded thereinto when the electroluminescent device is formed on the structure of the substrate according to the present invention, its manufacturing efficiency can be enhanced.

Although it is required that a regular and linear pattern of cathode electrodes be formed in manufacturing the organic electroluminescent device, it is difficult to employ wet etching in view of the characteristics of organic material. However, by forming the cathode separators 60 using photolithography before laminating the organic material on the ITO anode electrodes, the above limitation can be overcome.

In a case where this manufacturing method is employed to the structure of the substrate of the present invention, the separators 60 can be formed on the ITO anode electrodes 10 which have been formed not to protrude but to be flat. Thus, its manufacturing efficiency can be maximized.

Figure 7:
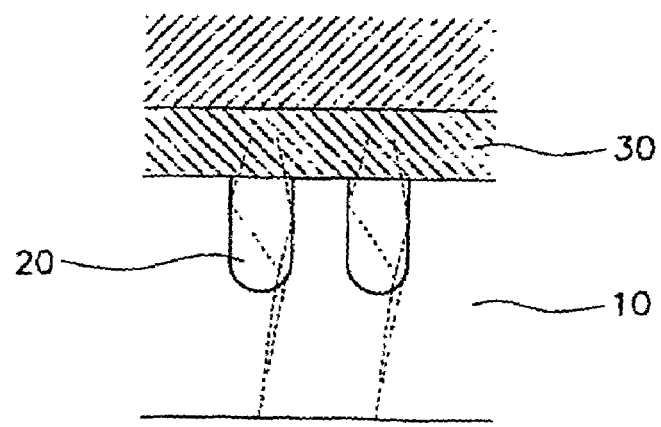
FIG. 7 is an enlarged sectional view showing an interface of an electroluminescent device formed on the structure of the substrate shown in FIG. 6.

Further, as another embodiment, in the etching step S6, the etched portions (grooves) 11 may be etched so that their cross-section takes a curved shape such as a ellipse, a semi-circle and a parabola in order to allow the substrate 10 to focus light, as shown in FIG. 7. This structure allows light created in an upper layer of the substrate due to the difference in refractive index between the ITO and the glass to propagate through the embedded electrodes and allows the curved surfaces of the distal ends of the grooves to exhibit lens effects. Thus, the intensity of front luminescence can be increased. Although it is ideal that the etched portions take the shape of the parabola in cross-section, the above object can be accomplished even when they are etched to take the semi-circle in cross-section.

Material used as the electrodes in the electrode forming step S7 of forming the electrodes in the etched portions of the substrate includes transparent metal oxides such as indium-tin-oxide, zinc oxide doped with aluminum or indium, tin oxide, tin oxide doped with zinc, magnesium-indium-oxide, nickel-tungsten-oxide, cadmium-tin-oxide, gallium-indium-oxide, gallium oxide, copper-aluminum-oxide, copper-gallium-oxide, strontium-copper-oxide, and silver-indium-oxide; nitride such as titanium nitride, gallium nitride, indium nitride, gallium-indium-nitride, aluminum-indium-nitride, aluminum-gallium-indium-nitride, and gallium nitride, indium nitride, aluminum-gallium-indium-nitride doped with silicon, magnesium or germanium; and a metal thin film of which the thickness is adjusted to allow 10% or higher of light to be permeated.

Hereinafter, the operation and effects of an embodiment of the present invention will be explained with reference to FIGS. 2 to 4.

The configuration of the electrodes formed on the substrate for the flat display device is a very important factor dominating the configuration of a thin film to be formed on the electrodes.

With the structure of the substrate with the electrodes embedded thereinto and the method of manufacturing the same, since the electrodes 20 formed on the substrate 10 are flush with the substrate 10, the substrate can be kept flat after the hole transport layer 30 and the electron transport layer 40 have been formed thereon. Thus a problem generated at edges of the thin film due to uneven formation thereof, which is a problem in the prior art, can be solved.

Particularly, according to the present invention, the height of the electrodes can be adjusted with respect to the substrate, irrespective of the thickness of the electrodes. Accordingly, since the thickness of the electrodes can be increased, the voltage drop due to the electrodes can be minimized. This exhibits this effect particularly in a case where the display device becomes larger in area.

Further, since there is no limitation on the depth of the electrodes, they can be easily adjusted in resistance.

Figure 6:
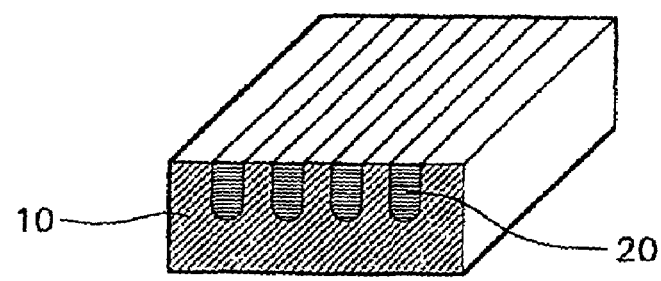
FIG. 6 is a perspective showing a structure of a substrate manufactured by another embodiment of the method of manufacturing the substrate with the electrodes embedded thereinto for use in the flat display device according to the present invention.

Hereinafter, the operation and effects of another embodiment of the present invention will be explained with reference to FIGS. 6 and 7.

With the development of etching techniques, the etched portions (grooves) 11 can be etched so that their cross-section takes the curved shape such as an ellipse, a semi-circle and a parabola in addition to a rectangular shape, as described above. In a case where the etching is thus carried out and the electrodes 20 are formed on the etched portions, there is an advantage in that an interface between the electrodes 20 and the substrate 10 serves as a lens to increase the intensity of luminescence emitted to the front of the substrate.

That is, the substrate 10 is made of glass having a refractive index of approximately 1.5, and the electrodes 20 are made of the transparent ITO electrodes having a refractive index of approximately 1.9 to 2.1. Thus, when light emitted from the luminescence layer 30 is diffused through the substrate, the intensity of luminescence is increased by means of focusing effects on inner spherical surfaces of the distal ends of the etched portions. In addition, as shown in FIG. 7, since total reflection is generated through the interface the efficiency of luminescence can be much more increased. During manufacture of this structure, a technical problem in filling the entire grooves with the transparent electrodes can be solved by forming the grooves, filling portions of the grooves with material having an appropriate refractive index, and then forming the transparent electrodes thereon.

In addition to the foregoing, the organic electroluminescent device comprising one or more layers of organic material between the transparent electrodes and the electrodes having the opposite polarity can be formed on the embedded electrodes. Here, even the electrodes having the opposite polarity may be formed at a level lower than top portions of the grooves of the substrate. In other words, after the grooves have been formed on the substrate and the transparent electrodes have been then embedded into the grooves, additional grooves are formed perpendicularly to the already formed grooves.

When an organic thin film is formed on the additional grooves, and thus, a thin film of the electrode material having the opposite polarity is formed without any shadow masks for concealing each pixel, the electrodes having the opposite polarity are electrically insulated from each other by the additional grooves formed perpendicularly to the transparent electrode. Thus, the insulated electrodes can be formed without any shadow masks.

In this case, since the organic thin film is placed within the grooves, portions exposed to the atmosphere are reduced. Thus, there can be obtained an advantage in that deterioration of the organic thin film can be improved without any additional protection layer.

INDUSTRIAL APPLICABILITY

According to the present inventions the problem produced in the electrodes of the flat display device can be overcome. Particularly, in a case where the invention is applied to the organic electroluminescent device the device can be kept flat even after the hole transport layer or the electron transport layer has been formed thereon and can maintain a uniform shape to allow the separators to be easily applied. As a result, since the problem produced in the marginal pixels can be solved, a yield of the electroluminescent device can be increased, the voltage drop due to the electrodes in a case where the display device becomes larger in area can be minimized, and the intensity of luminescence emitted to the front of the display device can be increased.

The invention claimed is:

1. An organic electroluminescent device, comprising:
   a substrate with first electrodes embedded thereinto for use in a flat display device and formed by etching first grooves in a top surface of the substrate in a predetermined pattern and then embedding the first electrodes into the etched first grooves in the substrate;
   second electrodes having a polarity opposite to that of the first electrodes and disposed on the substrate in second grooves formed in a direction perpendicular to the first electrodes embedded in the first grooves; and
   one or more layers of organic thin films inserted between the first and second electrodes.

2. The device as claimed in claim 1, wherein the first grooves are etched to take a curved shape in cross-section so that the substrate may focus light.

3. The device as claimed in claim 1, wherein the first electrodes are formed by partially or wholly filling the first grooves of the substrate with material having a refractive index equal to or different from that of the substrate.

4. The device as claimed in claim 1, wherein the first electrodes material includes transparent metal oxides such as indium-tin-oxide, zinc oxide doped with aluminum or indium, tin oxide, tin oxide doped with zinc, magnesium-indium-oxide, nickel-tungsten-oxide, cadmium-tin-oxide, gallium-indium-oxide, gallium oxide, copper-aluminum-oxide copper-gallium-oxide, strontium-copper-oxide, and silver-indium-oxide; nitride such as titanium nitride, gallium nitride, indium nitride, gallium-indium-nitride, aluminum-indium-nitride, aluminum-gallium-indium-nitride, and gallium nitride, indium nitride, aluminum-gallium-indium-nitride doped with silicon, magnesium or germanium; and a metal thin film of thickness adjusted to allow 10% or higher of light to be transmitted therethrough.

5. The device as claimed in claim 1, wherein the first electrodes, the second electrodes, and the one or more layers of organic thin films are formed as a whole in the first and second grooves etched into the substrate.

* * * * *